United States Patent
Hübner et al.

(10) Patent No.: US 6,906,370 B1
(45) Date of Patent: Jun. 14, 2005

(54) SEMICONDUCTOR COMPONENT HAVING A MATERIAL REINFORCED CONTACT AREA

(75) Inventors: Holger Hübner, Baldham (DE); Thomas Röhr, Puchheim (DE)

(73) Assignee: Infineon Technologies AG, Munich (DE)

(*) Notice: Subject to any disclaimer, the term of this patent is extended or adjusted under 35 U.S.C. 154(b) by 606 days.

(21) Appl. No.: 09/685,362

(22) Filed: Oct. 10, 2000

Related U.S. Application Data

(63) Continuation of application No. PCT/DE99/00894, filed on Mar. 25, 1999.

(30) Foreign Application Priority Data

Apr. 9, 1998 (DE) .......................................... 198 16 219

(51) Int. Cl.⁷ ............................................. H01L 27/108
(52) U.S. Cl. ..................... 257/296; 257/298; 257/306; 257/751; 257/758; 257/767; 257/768; 257/907
(58) Field of Search ................................. 257/296, 298, 257/306, 751, 758, 767, 768, 907

(56) References Cited

U.S. PATENT DOCUMENTS

| | | | |
|---|---|---|---|
| 4,406,549 A | 9/1983 | Takahashi | |
| 5,563,762 A * | 10/1996 | Leung et al. | 361/301.4 |
| 5,699,291 A | 12/1997 | Tsunemine | |
| 5,707,883 A | 1/1998 | Tabara | |
| 5,847,423 A * | 12/1998 | Yamamichi | 257/296 |
| 5,972,788 A * | 10/1999 | Ryan et al. | 438/634 |
| 6,130,449 A * | 10/2000 | Matsuoka et al. | 257/296 |
| 6,222,216 B1 * | 4/2001 | Rao et al. | 257/296 |
| 6,239,460 B1 * | 5/2001 | Kuroiwa et al. | 257/300 |

FOREIGN PATENT DOCUMENTS

| | | |
|---|---|---|
| DE | 37 28 979 A1 | 3/1989 |
| DE | 195 28 956 A1 | 2/1997 |
| DE | 196 18 934 A1 | 11/1997 |
| JP | 10-163440 A * | 6/1998 ......... H01L/27/108 |

OTHER PUBLICATIONS

International Patent Application 96/17386 (Leung), dated Jun. 6, 1996.

* cited by examiner

*Primary Examiner*—Tom Thomas
*Assistant Examiner*—Matthew E. Warren
(74) *Attorney, Agent, or Firm*—Laurence A. Greenberg; Werner H. Stemer; Ralph E. Locher

(57) ABSTRACT

A semiconductor component having a material-reinforced contact area formed of a metal layer is disclosed. The contact area is jointly formed by a second metal area of a first metal layer and a fourth metal area of a second metal layer which is to be contacted. A thickness of the contact area material is at least twice that of a single metal layer and thereby prevents penetrative etching when a hole is created for contacting the metal layer.

8 Claims, 1 Drawing Sheet

SEMICONDUCTOR COMPONENT HAVING A MATERIAL REINFORCED CONTACT AREA

CROSS-REFERENCE TO RELATED APPLICATION

This is a continuation of copending International Application PCT/DE99/00894, filed Mar. 25, 1999, which designated the United States.

BACKGROUND OF THE INVENTION

Field of the Invention

The invention is in the field of semiconductor technology and relates to a semiconductor component having first and second metal areas, which are both produced from a common first metal layer and are electrically insulated from one another. A second metal layer which is produced separately from the first metal layer and has a third metal area which is insulated from the first metal layer by the interposition of a dielectric layer is provided, where, together with the dielectric layer and the first metal area, it forms a memory element. A fourth metal area is provided in the second metal layer which, together with the second metal area, forms a contact area, and is used to make contact with the second metal layer. The invention also relates to a method for manufacturing the semiconductor component.

In semiconductor components, individual components or metal layers must be electrically connected to one another. Wiring planes, which are isolated from the individual components by insulation layers, are suitable for this purpose. In order to make contact with these components, the insulation layers have etched openings, which lead as far as the components or their contact points. Etching resist layers are normally used in order to prevent the layers located underneath from being etched through during the formation of the openings.

Such an etching resist layer on a metal layer is disclosed, for example, in U.S. Pat. No. 5,707,883. The etching resist layer, which in that case is composed of silicon nitrite, must, however, be removed in an insulation layer disposed above the metal layer, once the contact openings have been formed, since silicon nitrite is not electrically conductive. Additional process steps are therefore required for the production of the semiconductor component.

A semiconductor component of the type mentioned initially and in which a double-layer metal layer is provided as the contact to a contact hole located under the double-layer metal layer can be found in International Disclosure WO 96/17386 A1. The semiconductor component described there is, finally, seated on contact metallization so that no further contact-making is possible. However, this is fundamentally essential for higher integration layers in semiconductor components.

SUMMARY OF THE INVENTION

It is accordingly an object of the invention to provide a semiconductor component that overcomes the above-mentioned disadvantages of the prior art methods and devices of this general type, in which it is possible to make contact with the metal layer with little expenditure, and to specify a method for producing such a semiconductor component.

With the foregoing and other objects in view there is provided, in accordance with the invention, a semiconductor component containing a first metal layer forming a first metal area and a second metal area electrically insulated from one another; a dielectric layer; and a second metal layer produced separately from the first metal layer and forming a third metal area insulated from the first metal layer by an interposition of the dielectric layer. The third metal area together with the dielectric layer and the first metal area forms a memory element, the second metal layer further forming a fourth metal area which together with the second metal area forms a contact area used to make contact with the second metal layer. An insulation layer covers the contact area and the memory element and has at least one opening formed therein and leading to the contact area. An electrically conductive material fills the opening for making contact with the second metal layer.

The first part of the object is achieved according to the invention in the case of a semiconductor component of the type mentioned initially in that the insulation layer, which covers the contact area and the memory element, has at least one opening. The opening leads to the contact area and is filled with an electrically conductive material in order to make contact with the second metal layer.

The idea on which the invention is based is that the metal layer with which contact is to be made is partially or completely reinforced by individual areas of a further metal layer, as a result of which contact areas where the material is reinforced are produced. This is achieved essentially by structuring in places the first metal layer and the second metal layer, with which contact is to be made, with the two metal layers covering one another in places, where they jointly form the contact areas. Such contact areas are preferably created during the production of semiconductor components with memory cells. Such a memory cell is in this case formed by the first and third metal layers, which are insulated from one another by the interposition of the dielectric layer. For example, the second metal area and the fourth metal area disposed above it, which together form the contact area, are located at the side, adjacent to the memory cell. The first and the second metal area are produced from the first metal layer while, the third and the fourth metal area are produced from a second metal layer. The contact area is preferably connected to further components on the semiconductor component at least by one of the two metal layers, by which contact can be made with the latter components on the contact area. The material reinforcement in the contact area allows relatively thin metal layers to be used, which could otherwise be destroyed during the process of etching contact holes. Furthermore, the contact areas where the material is reinforced have improved electrical contact characteristics.

An advantageous embodiment of the invention is characterized in that the contact area is used as an etching resist during etching of the opening. The contact area at the same time acts as an etching resist, since the material there is reinforced in comparison with an individual metal layer, and it thus takes longer to etch through it. The invention results in that there is no need for any additional etching resist, resulting in process-engineering improvements and a cost reduction.

A further advantageous embodiment of the invention is characterized in that the fourth metal area makes direct contact with the second metal area. For this purpose, the dielectric insulation layer that is deposited over the entire surface during the production process is structured separately and, in the process, is removed in particular from the second metal area. The second metal layer, which is then deposited over the entire surface thus makes direct contact with the second metal area, where it forms the contact area. Its material thickness is thus equal to the sum of the material thickness of the first and of the second metal layer. The isolation (which is advantageous in this embodiment) of the structuring of the dielectric layer from the structuring of the second metal layer allows the use of structuring methods which are optimally matched to the respective materials.

A further advantageous embodiment of the invention is characterized in that the fourth metal area is insulated from the second metal area by the interposition of the dielectric layer.

In the process for forming the contact areas, the dielectric layer and the second metal layer are structured jointly, saving process steps. In this case, the relatively sensitive dielectric layer is advantageously protected during all the process steps by the metal layer disposed above it. Although, in this embodiment, the second and the fourth metal area are isolated from one another by the dielectric layer, the contact area still carries out its function. Even in the event of any possible etching through the fourth metal area and the dielectric layer, the etching process is delayed to a sufficient extent at least by the second metal area located underneath, thus avoiding the entire contact area being etched through. The contact, for example with the second metal layer, is then made on its annular rim in the contact hole. The surface of the annular rim is of the same order of magnitude as the cross section of the contact hole, particularly in the case of small contact holes.

A further advantageous embodiment of the invention is characterized in that the second metal layer has an electrically conductive connection between the third and the fourth metal area. This allows contact to be made with the memory cell in a simple way that is used, in particular, for potential-bonding with the electrode formed by the third metal area.

A further advantageous embodiment of the invention is characterized in that the first and the second metal layer are composed of a noble metal, in particular platinum or a platinum alloy.

According to the invention, it is also possible to make contact with platinum electrodes in a particularly advantageous manner.

A further advantageous embodiment of the invention is characterized in that the dielectric layer is composed of a ceramic material having a high dielectric constant, or of a ferroelectric ceramic material. Ceramic materials having a high dielectric constant or ceramic materials having ferroelectric characteristics are used to increase the integration density, as a result of which high storage densities can be achieved.

The second part of the above-mentioned object is achieved according to the invention by a method for producing a semiconductor component. The method includes the steps of:

a) providing a semiconductor component;
b) applying a first metal layer to a surface of the semiconductor component;
c) selectively removing the first metal layer for forming a first metal area and a second metal area electrically insulated from the first metal area;
d) applying a dielectric layer to the surface of the semiconductor component, to the first metal area and the second metal area;
e) selectively removing the dielectric layer with the dielectric layer remaining at least on the first metal area;
f) applying a second metal layer to the surface;
g) selectively removing the second metal layer for forming further metal areas including a third metal area remaining on the first metal area, and a fourth metal area remaining on said second metal area, and the fourth metal area together with the second metal area forming a contact area;
h) applying an insulation layer on the surface; and
i) selectively etching through the insulation layer as far as the contact area, with the contact area used as an etching resist during the process of etching through the insulation layer.

First, the first metal layer is deposited onto the surface of the semiconductor component, and this is followed by selective removal of this layer, forming the first and second metal areas. After this, the dielectric layer is then applied over the entire surface and is structured, with the dielectric layer remaining at least on the first metal area in order to form the memory cell. In a further method step, the second metal layer is deposited onto the surface of the semiconductor component, and the surface is then structured. The third and the fourth metal areas are produced in the process. The first and the third metal areas together with the dielectric layer disposed between them form the memory cell while, in contrast, the second and the fourth metal areas represent the contact area. For insulation, an insulation layer is deposited over the entire area of the surface, and contact holes are then created in it in order to make contact with the second metal layer and with other metal layers and/or components. If the individual contact holes are etched to different depths, the contact holes which need to be created to lesser depths are, in particular, severely over etched. In order to prevent the layer located underneath from being etched through there, the second metal layer, for example, is supported in its fourth metal area by the second metal area (located underneath it) of the first metal layer. The contact area, where the material is reinforced and which is formed in this way, takes considerably longer to etch through than a single layer. There is thus no need for any additional etching resist layer.

One advantageous embodiment of the production method is characterized in that, after the selective removal of the second layer, electrically conductive connections that are formed by the second metal layer remain between the third and the fourth metal areas. These connections are formed from the second metal layer while it is being structured.

In accordance with a concomitant feature of the invention, there is the step of forming at least one further opening in the insulation layer during the selectively etching step.

Other features which are considered as characteristic for the invention are set forth in the appended claims.

Although the invention is illustrated and described herein as embodied in a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
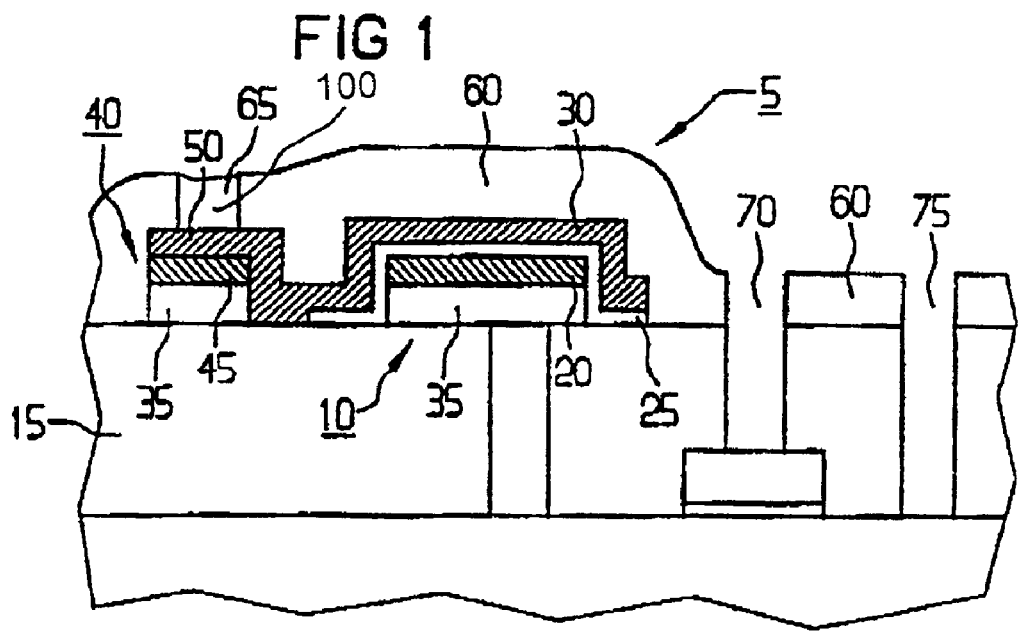
FIG. 1 is a diagrammatic, sectional view of a semiconductor component having a contact area which is formed by direct contact between a second and a fourth metal area according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor component 5 with a memory cell 10. The memory cell 10 is disposed on an intermediate oxide 15 and is formed in layers from a first metal area 20, a dielectric layer 25 and a third metal area 30, with the two metal areas 20 and 30 representing the electrodes of the memory cell 10. The first metal area 20 is seated on a barrier layer 35 in order to prevent oxygen diffusion into the dielectric layer 25. A contact area 40 is disposed at the side adjacent to the memory cell 10, and is formed from a second metal area 45 and a fourth metal area 50, which makes direct contact with it. The third metal area 30 and the fourth metal area 50 are electrically connected to one another.

The memory cell 10 and the contact area 40 are essentially formed from two successively deposited metal layers, by selective etching. For this purpose, the barrier layer 35 is deposited first of all onto a surface of the semiconductor component 5, followed by a first metal layer 20, 45. Once these two layers have been jointly structured, during which process the first metal area 20 and the second metal area 45 are formed, this is followed by the dielectric layer 25 being deposited over the entire area by a metal-organic chemical vapor deposition process (MOCVD).

In a further method step, the dielectric layer 25, which is composed of a ceramic material having a high dielectric constant, is removed from the second metal area 45. A second metal layer 30, 50 is then deposited and is structured, with the fourth metal area 50 of the second metal layer covering the second metal area 45 where, together with the latter, it forms the contact area 40. The material thickness of the contact area 40 thus corresponds approximately to twice the material thickness of one of the two metal layers. If the contact area 40 is formed in steps or depressions on the surface of the semiconductor component 5, the material thickness may advantageously be even greater, as well.

In a subsequent method step, an intermediate oxide 60 is applied over the entire surface and is masked, after which contact holes are formed. A first contact hole 65 passes through the intermediate oxide 60 as far as the contact area 40, and two further contact holes 70 and 75, which are considerably deeper, additionally pass through the intermediate oxide 15. Since the contact area 40 has twice a material thickness, the etching process in the area of the contact hole 65 is delayed to a sufficient extent during the formation of the contact holes 65, 70 and 75 to prevent the over etching which is required there leading to the contact area 40 being etched through. The contact holes 65, 70 and 75, which are of different depths, can thus be produced in a 1B joint etching process without using an additional resist layer on the contact area 40.

The opening 65 can be filled with an electrically conductive material 100 for making contact with the contact area 40.

Figure 2:
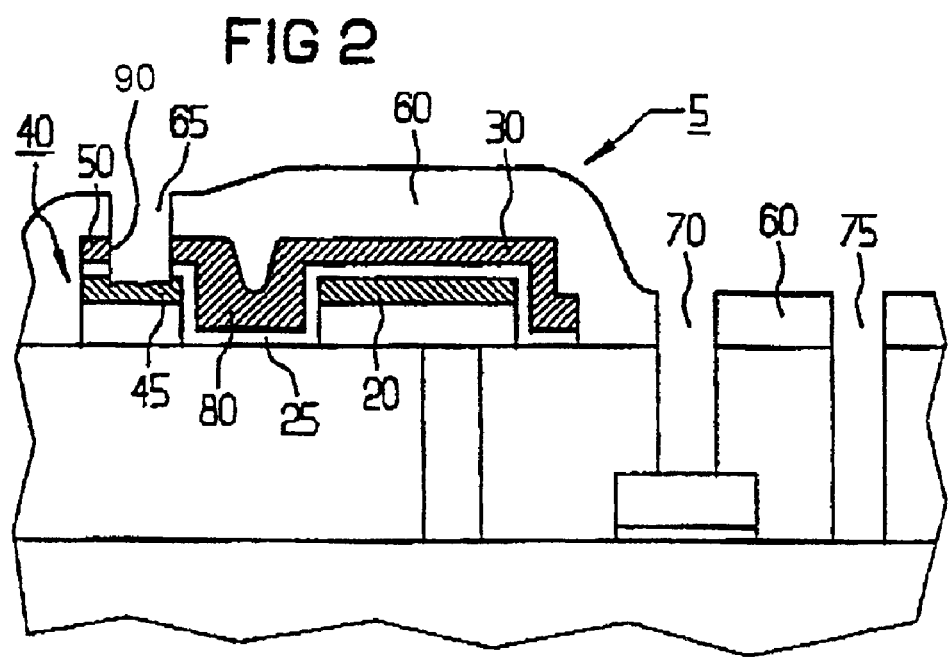
FIG. 2 is a sectional view of the semiconductor component having a dielectric layer that is left in the contact area.

FIG. 2 shows the semiconductor component 5 in which the contact area 40 is formed by the interposition of the dielectric layer 25. Here, in order to simplify the process further, the dielectric layer 25 and the second metal layer have been structured together. The second metal area 45, the dielectric layer 25 and the fourth metal area 50 now act jointly as an etching resist. This layer structure of the contact area 40 also prevents complete etching through, to a sufficient extent. If the fourth metal area 50, which is located above, is completely or partially etched through, which may occur, contact is made with it in the contact hole 65 on an annular rim 90 formed by it. The area of the rim 90 presented to the contact hole is in the same order of magnitude as its cross section, particularly in the case of contact holes having a small cross section.

Platinum alloys or platinum are preferably used for the two metal layers. In consequence, ferroelectric materials, such as strontium bismuth tantalite, can also be used for the dielectric layer 25, and these contribute to an improved specific storage density.

The contact area 40 can be used to make contact with one or more of the memory cells 10. The electrically conductive connection between the contact area 40 and the memory cells 10 is produced by conductor tracks 80 which are formed during the structuring of the second metal layer 30, 50. In consequence, the contact area 40 and the memory cells 10 may also be physically separated well away from one another. On the other hand, an electrically conductive connection may also be left between the first metal area and the contact area 40, in which case the conductor tracks 80 are then produced from the first metal layer.

In principle, the contact areas according to the invention can also be used to make contact with other components on the semiconductor component S. For this purpose, the metal areas 45 and 50 which are electrically insulated from the memory cell 10 remain on the surface of the semiconductor component 5 after the etching of the first and second metal layer, and are used as wiring to make contact with further components, with the material in the contact areas of this wiring being reinforced by the first and the second metal layers being located one on top of the other.

We claim:

1. A semiconductor component, comprising:
a first metal layer forming a first metal area and a second metal area electrically insulated from one another;
a dielectric layer;
a second metal layer produced separately from said first metal layer and forming a third metal area insulated from said first metal layer by an interposition of said dielectric layer, and said third metal area together with said dielectric layer and said first metal area forms a memory element, said second metal layer further forming a fourth metal area which together with said second metal area forms a contact area used to make contact with said second metal layer and said second metal layer having an electrically conductive connection between said third metal area and said fourth metal area;
an insulation layer covering said contact area and said memory element and having at least one opening formed therein and leading to said contact area; and
an electrically conductive material filling said opening for making contact with said second metal layer.

2. The semiconductor component according to claim 1, wherein said contact area is used as an etching resist during etching of said opening.

3. The semiconductor component according to claim 1, wherein said fourth metal area makes direct contact with said second metal area.

4. The semiconductor component according to claim 1, wherein said fourth metal area is insulated from said second metal area by the interposition of said dielectric layer.

5. The semiconductor component according to claim 1, wherein said first metal layer and said second metal layer are composed of a noble metal.

6. The semiconductor component according to claim 5, wherein said noble metal is selected from the group consisting of platinum and platinum alloys.

7. The semiconductor component according to claim 1, wherein said dielectric layer is composed of a material selected from the group consisting of a ceramic material having a high dielectric constant and a ferroelectric ceramic material.

8. The semiconductor component according to claim 1, wherein at least one further opening is formed in said insulation layer.

* * * * *